(12) United States Patent
Han et al.

(10) Patent No.: US 12,228,967 B2
(45) Date of Patent: Feb. 18, 2025

(54) ELECTRONIC DEVICE INCLUDING PHOTOSENSOR MODULE

(71) Applicant: SAMSUNG ELECTRONICS CO., LTD., Suwon-si (KR)

(72) Inventors: Seonho Han, Suwon-si (KR); Donghoo Jang, Suwon-si (KR); Jongah Kim, Suwon-si (KR); Shinhun Moon, Suwon-si (KR); Hyungsoo Park, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 241 days.

(21) Appl. No.: 17/685,228

(22) Filed: Mar. 2, 2022

(65) Prior Publication Data

US 2022/0187869 A1    Jun. 16, 2022

Related U.S. Application Data

(63) Continuation of application No. PCT/KR2020/011703, filed on Sep. 1, 2020.

(30) Foreign Application Priority Data

Sep. 5, 2019  (KR) .................. 10-2019-0110274

(51) Int. Cl.
*G06F 1/16* (2006.01)
*G04G 9/00* (2006.01)
*G04G 17/04* (2006.01)

(52) U.S. Cl.
CPC ............. *G06F 1/163* (2013.01); *G04G 9/007* (2013.01); *G04G 17/045* (2013.01); *H05K 2201/055* (2013.01); *H05K 2201/10151* (2013.01)

(58) Field of Classification Search
CPC ...... G06F 1/163; G06F 1/1637; G06F 1/1647; G06F 1/1684; G04G 21/00; G04G 21/02;
(Continued)

(56) References Cited

U.S. PATENT DOCUMENTS 6,825,551 B1 * 11/2004 Vieira ................. H01L 23/3107
257/666
8,033,446 B2 * 10/2011 Wada ................... B23K 1/0016
257/737
(Continued)

FOREIGN PATENT DOCUMENTS

EP      3226101        10/2017
JP      2005-70131     3/2005
(Continued)

OTHER PUBLICATIONS

European Search Report dated Oct. 21, 2022 issued in EP Patent Application No. 20861672.2-1224.
(Continued)

*Primary Examiner* — Adrian S Wilson
*Assistant Examiner* — Gage Crum
(74) *Attorney, Agent, or Firm* — Nixon & Vanderhye P.C.

(57) ABSTRACT

An electronic device according to various embodiments of the present disclosure may comprise: a housing including a front plate facing forward and a rear plate facing rearward; a display assembly comprising a display visible through at least a portion of the front plate and which includes an upper portion, a lower portion overlapping at least a partial region of the upper assembly and that includes a first opening, and a flexible circuit board overlapping at least a partial region of the lower portion and that includes a second opening corresponding to at least a portion of the first opening; a photosensor module including a sensing unit comprising a sensor corresponding to at least a portion of the second
(Continued)

opening, and a plurality of pads arranged to be adjacent to the sensing unit and electrically coupled to the flexible circuit board; and an electrical component and/or mechanical structure arranged between the photosensor module and the rear plate and spaced from the photosensor module at a first distance.

20 Claims, 8 Drawing Sheets

(58) Field of Classification Search
CPC ...... G04G 17/04; G09G 5/10; G02F 1/13318; H05K 2201/055; H05K 2201/10151; H04M 1/02
See application file for complete search history.

(56) References Cited

U.S. PATENT DOCUMENTS

| | | |
|---|---|---|
| 2007/0200817 A1* | 8/2007 | Tsai .................. G02F 1/133604 345/102 |
| 2012/0170284 A1* | 7/2012 | Shedletsky .......... G01J 1/0407 362/355 |
| 2013/0242479 A1 | 9/2013 | Yoo et al. |
| 2014/0152632 A1 | 6/2014 | Shedletsky et al. |
| 2014/0183342 A1 | 7/2014 | Shedletsky et al. |
| 2015/0069921 A1 | 3/2015 | Carmel-Veilleux |
| 2015/0144934 A1 | 5/2015 | Rappoport et al. |
| 2015/0378487 A1* | 12/2015 | Meer ..................... G04G 21/00 345/32 |
| 2016/0116777 A1* | 4/2016 | Kubota ............. G02F 1/133608 250/206 |
| 2017/0045918 A1* | 2/2017 | Han ...................... G06F 1/1684 |
| 2017/0134545 A1 | 5/2017 | Lee et al. |
| 2017/0221450 A1 | 8/2017 | Kim et al. |
| 2017/0364763 A1 | 12/2017 | Jin et al. |
| 2018/0260602 A1* | 9/2018 | He ....................... A61B 5/0075 |
| 2018/0267385 A1* | 9/2018 | Nakanishi ............... H02S 20/30 |
| 2018/0268232 A1 | 9/2018 | Kim et al. |
| 2019/0302914 A1* | 10/2019 | Zhang .................. G06F 1/1643 |
| 2020/0342202 A1 | 10/2020 | Bae et al. |
| 2020/0349904 A1 | 11/2020 | Uchida et al. |
| 2021/0004117 A1 | 1/2021 | Kim et al. |
| 2021/0174044 A1 | 6/2021 | Jo et al. |

FOREIGN PATENT DOCUMENTS

| | | |
|---|---|---|
| JP | 2009-65245 | 3/2009 |
| JP | 2009-111494 | 5/2009 |
| JP | 2019-113815 | 7/2019 |
| KR | 10-2013-0105125 | 9/2013 |
| KR | 10-2014-0122589 | 10/2014 |
| KR | 10-2016-0003499 | 1/2016 |
| KR | 10-2017-0090951 | 8/2017 |
| KR | 10-2017-0141522 | 12/2017 |
| KR | 10-2018-0085423 | 7/2018 |
| KR | 10-2018-0106527 | 10/2018 |
| KR | 10-2019-0062143 | 6/2019 |
| KR | 10-2019-0066795 | 6/2019 |
| WO | 2019/088667 | 5/2019 |
| WO | WO-2019141060 A1 * | 7/2019 |
| WO | WO-2020224359 A1 * | 11/2020 |
| WO | WO-2021221347 A1 * | 11/2021 |

OTHER PUBLICATIONS

International Search Report with Translation for PCT/KR2020/011703 dated Nov. 25, 2020, 5 pages.
Written Opinion of the ISA for PCT/KR2020/011703 dated Nov. 25, 2020, 4 pages.
Korean Office Action dated May 16, 2024 for KR Application No. 10-2019-0110274.
Korean Office Action dated Jan. 2, 2025 for KR Application No. 10-2019-0110274.

* cited by examiner

ELECTRONIC DEVICE INCLUDING PHOTOSENSOR MODULE

CROSS-REFERENCE TO RELATED APPLICATIONS

This application is a continuation of International Application No. PCT/KR2020/011703 designating the United States, filed on Sep. 1, 2020, in the Korean Intellectual Property Receiving Office and claiming priority to Korean Patent Application No. 10-2019-0110274, filed on Sep. 5, 2019, in the Korean Intellectual Property Office, the disclosures of which are incorporated by reference herein in their entireties.

BACKGROUND

Field

The disclosure relates to an electronic device including a photosensor module.

Description of Related Art

Owing to the remarkable development of information and communication technology and semiconductor technology, various electronic devices have been proliferated rapidly and used increasingly. Particularly, recent electronic devices have been developed such that users communicate while carrying them.

An electronic device refers to a device that executes a specific function according to an installed program, such as an electronic notebook, a portable multimedia player, a mobile communication terminal, a tablet PC, a video/audio player, a desktop/laptop computer, and a vehicle navigation device as well as a home appliance. For example, these electronic devices may output stored information visually or audibly. As the integration level of electronic devices increases and high-speed and large-capacity wireless communication becomes common, a single electronic device such as a mobile communication terminal may be equipped with various functions. For example, a communication function, an entertainment function such as games, a multimedia function such as music/video playback, communication and security functions for mobile banking, schedule management, and an electronic wallet are integrated into one electronic device. Such electronic devices are being miniaturized so that users may conveniently carry them.

Recently, wearable electronic devices of various shapes, such as glasses or a watch, have been developed so that the electronic devices may be worn on the body. In a wearable electronic device, the brightness of a display assembly or a keypad assembly is automatically adjusted according to the illuminance value of an ambient environment by embedding a photosensor module (e.g., an illuminance sensor module) around the periphery of an active area. For example, a display screen is made brighter in a relatively bright environment and darkened in a relatively dark environment, for efficient power use.

In general, the photosensor module may be mounted in a peripheral area (e.g., a non-active area or a shielding area) outside the active area of the display assembly, to sense light. When this photosensor module is mounted, the aesthetics of the electronic device may be deteriorated due to a design constraint that the photosensor module should be designed in consideration of interference with other internal components (e.g., a speaker, a front camera, or the display assembly) and outward exposure of the photosensor module.

To couple a photosensor module mounted on the rear surface of the display assembly to a display circuit board, a flexible printed circuit board (FPCB) may be fabricated and then coupled to the photosensor module. In another example, the thickness of the photosensor module may be set to be different for each structure (e.g., model) of an electronic device, or an interposer printed circuit board (PCB) may be additionally manufactured. Accordingly, additional cost for manufacturing the separate PCB, cost for an additional process for combining the PCB with the photosensor module, and manufacturing defects may occur.

SUMMARY

Embodiments of the disclosure may provide a photosensor module disposed on the rear surface of a display assembly to sense light through an active area of the display assembly.

Embodiments of the disclosure may provide a photosensor module manufactured by directly coupling the photosensor module to a display circuit board. Accordingly, an interposer PCB or a separate FPCB may be removed.

According to various example embodiments of the disclosure, an electronic device may include: a housing including a front plate facing a front surface and a rear plate facing a rear surface, a display assembly comprising a display visible through at least a part of the front plate, wherein the display assembly includes: an upper portion, a lower portion disposed overlapping with at least a partial area of the upper portion and including a first opening, and a flexible circuit board overlapping at least a partial area of the lower portion and including a second opening corresponding to at least a part of the first opening, a photosensor module including a sensing unit comprising a sensor corresponding to at least a part of the second opening and a plurality of pads disposed adjacent to the sensing unit and electrically coupled to the flexible circuit board, and an electrical or mechanical structure comprising circuitry and/or hardware disposed between the photosensor module and the rear plate and spaced apart from the photosensor module by a first distance.

According to various example embodiments of the disclosure, an electronic device may include: a front plate forming at least a part of a front surface of the electronic device, a rear plate forming a least a part of a rear surface of the electronic device, a display assembly comprising a display disposed adjacent to the front plate and visible through at least a part of the front plate, wherein the display assembly includes: a plurality of layers with a first opening passing through at least some of the layers formed therein, and a flexible circuit board disposed under the plurality of layers and including a second opening which is smaller than the first opening and corresponding to at least a part of the first opening, and a photosensor module including a photosensor positioned under the flexible circuit board and coupled with the flexible circuit board through a plurality of pads.

In an electronic device according to various example embodiments of the disclosure, a photosensor module may be located in the active area of a display assembly, so that design freedom for mounting the photosensor module and design aesthetics may be realized.

The electronic device according to various example embodiments of the disclosure may have a reduced thickness by arranging the photosensor module directly on a display circuit board.

The electronic device according to various example embodiments of the disclosure may adjust the brightness of the display adaptively according to the brightness of external light through the photosensor module disposed in the active area of the display assembly.

BRIEF DESCRIPTION OF THE DRAWINGS

The above and other aspects, features and advantages of certain embodiments of the present disclosure will be more apparent from the following detailed description, taken in conjunction with the accompanying drawings, in which.

DETAILED DESCRIPTION

Figure 1:
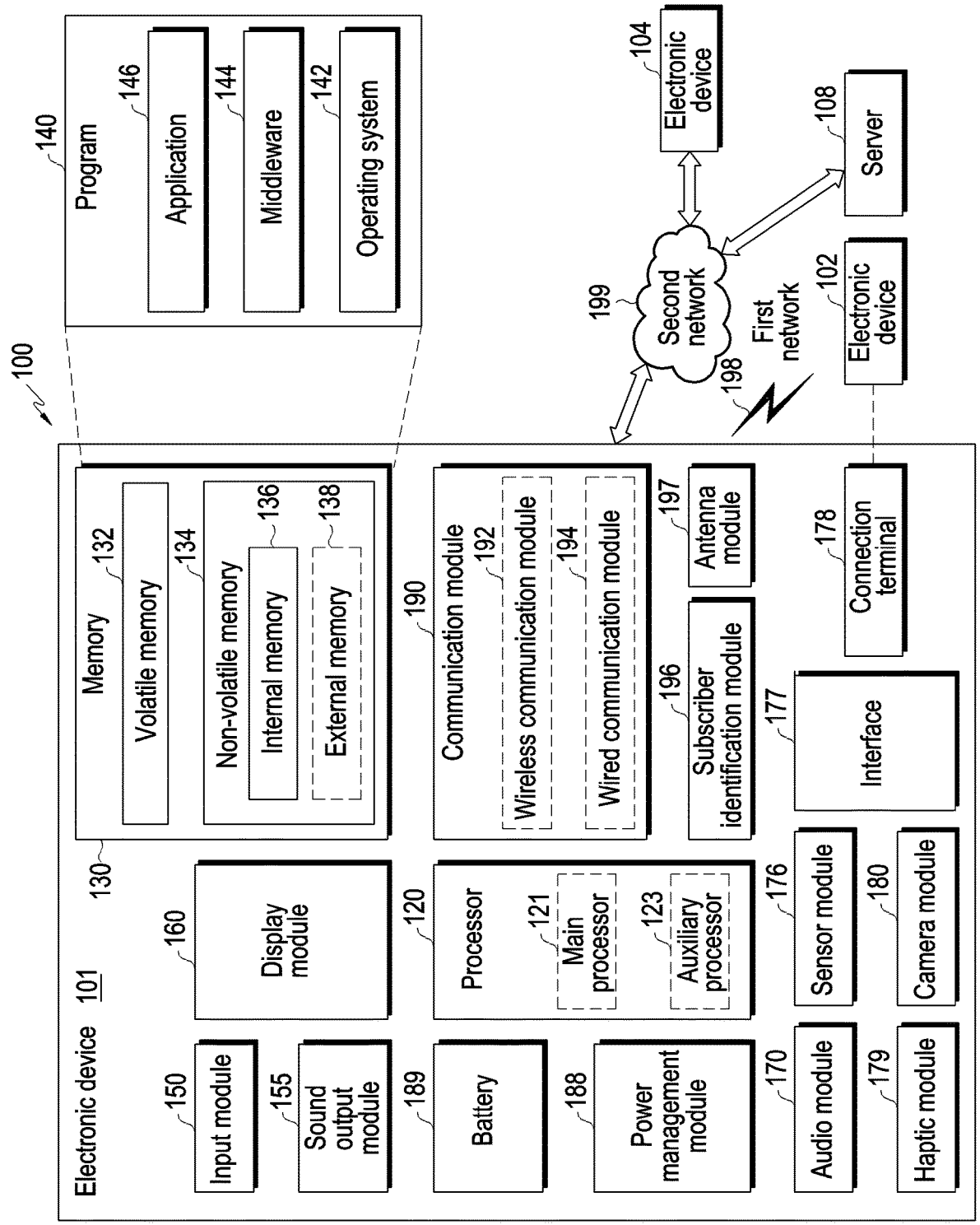
FIG. 1 is a block diagram illustrating an example electronic device in a network environment according to various embodiments.

FIG. 1 is a block diagram illustrating an example electronic device 101 in a network environment 100 according to various embodiments.

Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In various embodiments, at least one (e.g., the display device 160 or the camera module 180) of the components may be omitted from the electronic device 101, or one or more other components may be added in the electronic device 101. In various embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to an embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, a keyboard, or a digital pen (e.g., a stylus pen).

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include an antenna including a radiating element including a conductive material or a conductive pattern formed in or on a substrate (e.g., PCB). According to an embodiment, the antenna module 197 may include a plurality of antennas. In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

The electronic device according to various embodiments may be one of various types of electronic devices. The electronic devices may include, for example, a portable communication device (e.g., a smartphone), a computer device, a portable multimedia device, a portable medical device, a camera, a wearable device, a home appliance, or the like. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B", "at least one of A and B", "at least one of A or B," "A, B, or C," "at least one of A, B, and C," and "at least one of A, B, or C" may include any one of, or all possible combinations of the items enumerated together in a corresponding one of the phrases. As used herein, such terms as "1st" and "2nd", or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), the element may be coupled with the other element directly (e.g., wiredly), wirelessly, or via a third element.

As used herein, the term "module" may include a unit implemented in hardware, software, or firmware, or any combination thereof, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the 'non-transitory' storage medium is a tangible device, and may not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2:
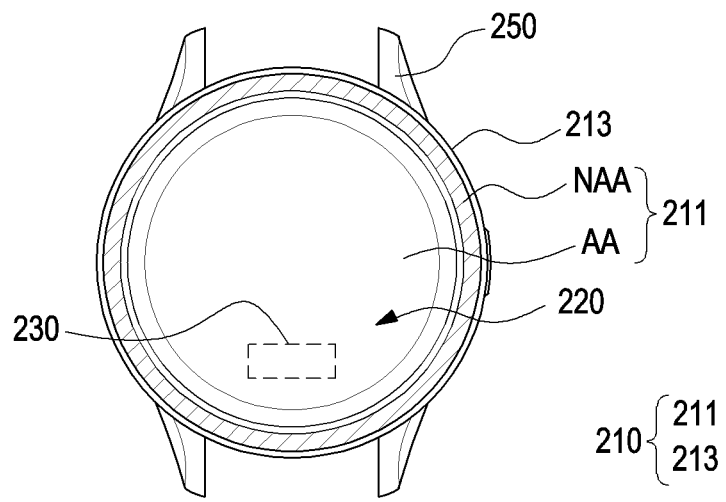
FIG. 2 is a diagram illustrating a front view of an example electronic device according to various embodiments.
Figure 3:
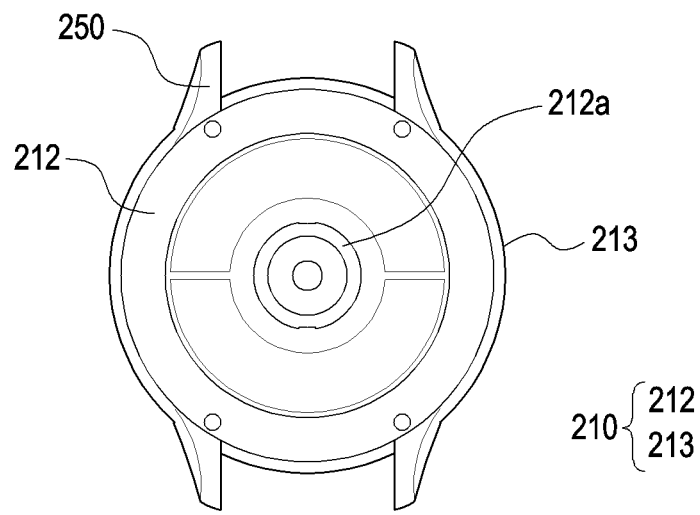
FIG. 3 is a diagram illustrating a rear view of an example electronic device according to various embodiments.

FIG. 2 is diagram illustrating a front view of an example electronic device according to various embodiments. FIG. 3 is a diagram illustrating a rear view of the electronic device of FIG. 2 according to various embodiments.

The electronic device 101 according to various embodiments of the disclosure may be a portable communication device such as a mobile communication terminal or a wearable electronic device that may be worn on a user's body. Hereinafter, an electronic device according to various embodiments of the disclosure will be described as a smart watch, by way of non-limiting example.

Referring to FIGS. 2 and 3, the electronic device 101 according to various embodiments of the disclosure may include a housing 210, a display assembly 220, a photosensor module 230, and locking members 250.

According to various embodiments, the housing 210 forms the exterior of the electronic device 101, and electronic components may be arranged in the housing 210. For example, various circuit devices, for example, the processor 120 (e.g., an application processor (AP)), the memory 130, the input device 150, the sound output device 155, and/or the battery 189 described above with reference to FIG. 1 may be arranged in the housing 210.

According to various embodiments, the housing 210 may include a first surface 211 (e.g., front surface) at least partially facing a first direction, a second surface 212 (e.g., rear surface) at least partially a second direction opposite to the first direction, and a side surface 213 surrounding at least a part of a space between the first surface 211 and the second surface 212. In an embodiment (not shown), the housing may refer to a structure forming a part of the first surface 211, the second surface 212, and the side surface 213 illustrated in FIGS. 2 and 3.

According to an embodiment, at least a part of the first surface 211 may be formed by a substantially transparent front plate (e.g., a glass member or a polymer plate). The first surface 211 may provide a screen output from the display assembly 220 (e.g., the display device 160 of FIG. 1) disposed inside the housing 210 to face the first surface 211 to a user. For example, an analog watch-type screen may be visible through the first surface 211. According to an embodiment, an edge area of the first surface 211 may be bent toward the side surface 213 to extend seamlessly.

According to an embodiment, the second surface 212 may be formed by a substantially opaque rear plate. The second side 212 may be formed by, for example, coated or colored glass, ceramic, polymer, metal (e.g., aluminum, stainless steel (STS), or magnesium), or a combination of at least two of these materials. According to an embodiment, a separate plate member 212a may be integrally molded in one area (e.g., a central area) of the second surface 212. The plate member 212a may be formed to radiate light generated from a light source (e.g., a light source of a biosensor) disposed inside the housing 210 to the outside. According to an embodiment, another area (e.g., an edge area) of the second surface 212 may be bent toward the side surface 213 to extend seamlessly.

According to an embodiment, the side surface 213 may be coupled with the first surface 211 and the second surface 212 and form at least a part of the outer surface of the electronic device 200. To provide the electronic device 101 with increased structural stability, the side surface 213 may be formed of a material having high rigidity. For example, the side surface 213 may be formed of a metal material. In another example, the side surface 213 formed of metal may be used as an antenna radiator.

According to various embodiments, the first surface 211 of the housing 210 may be divided into an active area AA in which a screen is displayed and a non-active area NAA formed along the circumference of the AA. For example, the active area AA may be an area in which a screen is displayed by the display assembly 220 and an input and an output may be implemented by a touch panel (e.g., a touch panel 313 of FIG. 6). The non-active area NAA (e.g., a bezel area) may be located around the periphery of the active area AA, and signal lines or terminals provided in the touch panel or display panel (e.g., a display panel 317 of FIG. 6) may be disposed in the non-active area NAA. The non-active area NAA may be shielded by various colors or the housing 210 to limit outward exposure of the signal lines or terminals. In another example, the non-active area NAA may be formed of metal and used as an antenna radiator.

According to various embodiments, the locking members 250 may be disposed to protrude from the side surface 213 in a direction away from each other. The locking members 250 may be coupled with a wearing part (e.g., a strap or band, not shown) disposed to be worn on the user's wrist. For example, a plurality of fastening grooves for fastening the wearing part may be formed on side surfaces of the locking members 250. The wearing part may be formed of various materials (e.g., rubber, plastic, or metal).

According to various embodiments, the photosensor module 230 may be disposed at a position of the display assembly 220, for example, in the active area AA of the first surface 211. The photosensor module 230 may generate an electrical signal or data value corresponding to an internal operating state or ambient environmental state of the electronic device 101. The photosensor module 230 may further include, for example, at least one of a proximity sensor, an infrared (IR) sensor, an illuminance sensor.

Figure 4:
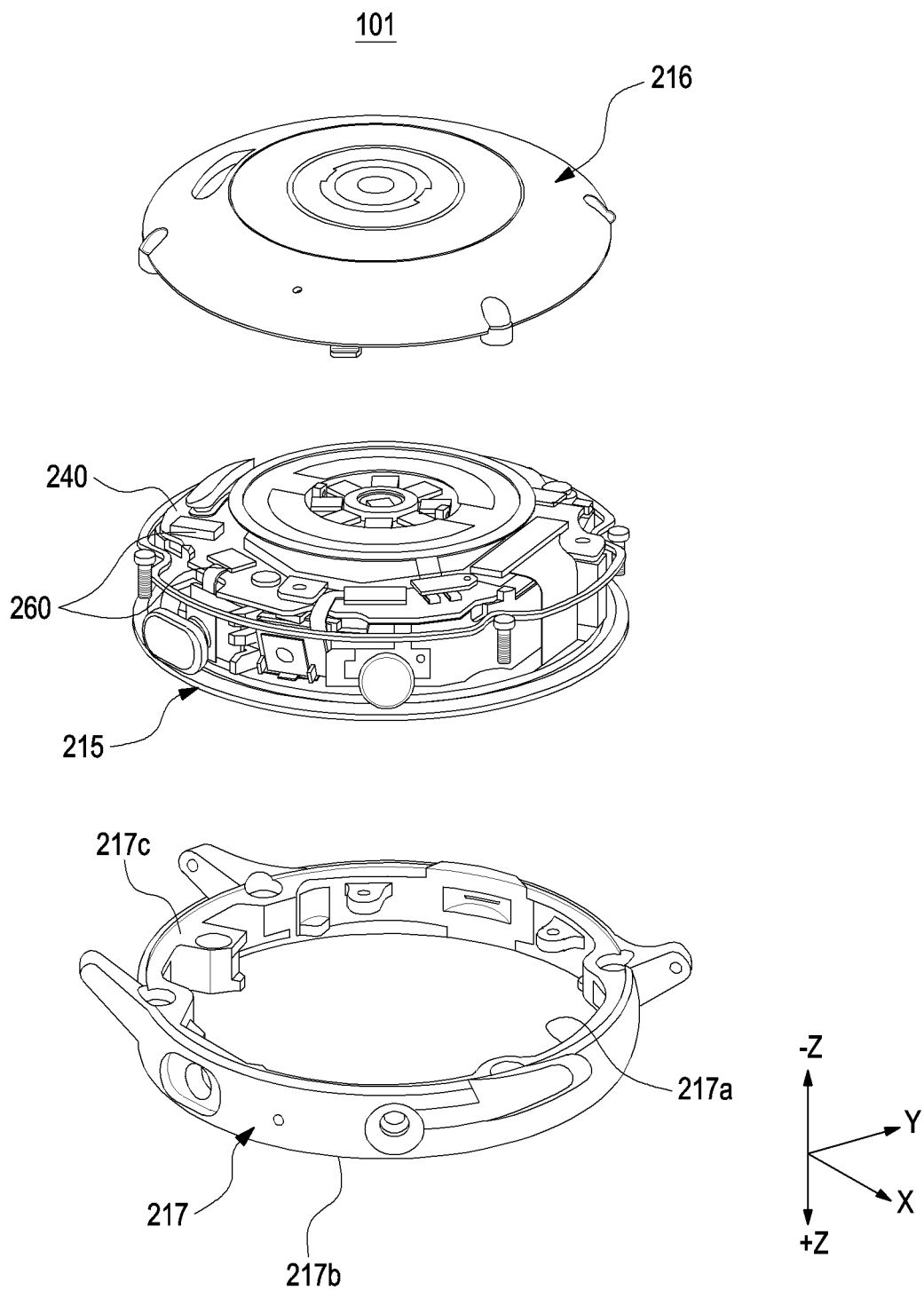
FIG. 4 is an exploded perspective view illustrating an electronic device according to various embodiments.

FIG. 4 is an exploded perspective view illustrating an electronic device according to various embodiments.

In FIG. 4, in a three-axis Cartesian coordinate system, a '+Z' direction may indicate the first direction, a '−Z' direction may indicate the second direction, and a 'Y' direction may indicate a third direction.

According to various embodiments, the electronic device 101 may include a front plate 215, a rear plate 216, a side member 217 (e.g., a bracket), a display assembly (e.g., the display assembly 220 of FIG. 3), an electronic component (e.g., including circuitry) 260, a main circuit board 240, and a battery (e.g., the battery 189 of FIG. 1). Referring to FIG. 4, the configurations of the front plate 215 and the rear plate 216 may be fully or partially identical to those of the front plate 215 and the rear plate 216 of FIGS. 2 and 3.

According to various embodiments, the front plate 215 and the rear plate 216 may be coupled with the side member 217. The side member 217 may include an inner surface 217a, a front surface 217b, and a rear surface 217c, and may be formed of a material that at least partially transmits a radio signal or a magnetic field. At least a part of the front plate 215 together with a sealing member (not shown) for waterproof/dustproof may be coupled with the front surface 217b of the side member 217. The rear plate 216 may contact the rear surface 217c of the side member 217 and may be coupled with the rear surface 217c by screw coupling.

According to various embodiments, the side member 217 may be formed of a material stronger than the rear plate 216 formed by injection. For example, the side member 217 may be formed of metal, and the rear plate 216 may be formed by injection molding of plastic. A main circuit board 240, a display assembly (e.g., the display assembly 220 of FIG. 3), a battery, and electronic components may be mounted in an inner space formed by the inner surface 217a of the side member 217.

According to various embodiments, various components of the electronic device 101 may be disposed on the main circuit board 240. For example, a processor, a communication module, and so on may be mounted in the form of an integrated circuit chip on the main circuit board 240. The main circuit board 240 may be electrically coupled to electronic components including a battery and an antenna radiator through a connector.

According to an embodiment, at least one of a processor (e.g., the processor 120 of FIG. 1), a memory (e.g., the memory 130 of FIG. 1), or an interface (e.g., the interface 177 of FIG. 1) may be disposed on the main circuit board 240. The processor may include, for example, at least one of a central processing unit, an application processor, a graphic processing unit (GPU), an application processor sensor processor, a communication processor, or the like. The memory may include, for example, volatile memory or non-volatile memory. The interface may include, for example, a high definition multimedia interface (HDMI), a universal serial bus (USB) interface, an SD card interface, and/or an audio interface. The interface may, for example, electrically or physically couple the electronic device 200 to an external electronic device and include a USB connector, an SD card/MMC connector, or an audio connector. According to an embodiment, the processor may control various components of the electronic device 101.

According to various embodiments, the electronic component 260 may include various components including, for example, an antenna radiator and/or a wireless charging antenna disposed on the main circuit board 240. The antenna radiator may transmit/receive a radio signal by magnetic secure transmission (MST). For example, the antenna radiator may be an MST antenna. In another example, the antenna radiator may be an NFC antenna that transmits/receives a wireless signal by near-field communication (NFC). Aside from being disposed on the main circuit board 240, the antenna radiator may be provided as a separate member and electrically coupled to the main circuit board 240. A shielding structure may be disposed around the antenna radiator to block signal interference between different electronic components. The wireless charging antenna may be attached to one surface of the main circuit board 240. The wireless charging antenna may be formed into a flat coil. The wireless charging antenna may be formed of a conductive material and electrically coupled to the main circuit board 240. The wireless charging antenna may generate a current by electromagnetic induction from an external electronic device. The current generated from the wireless charging antenna may charge the battery through the main circuit board 240.

Figure 5:
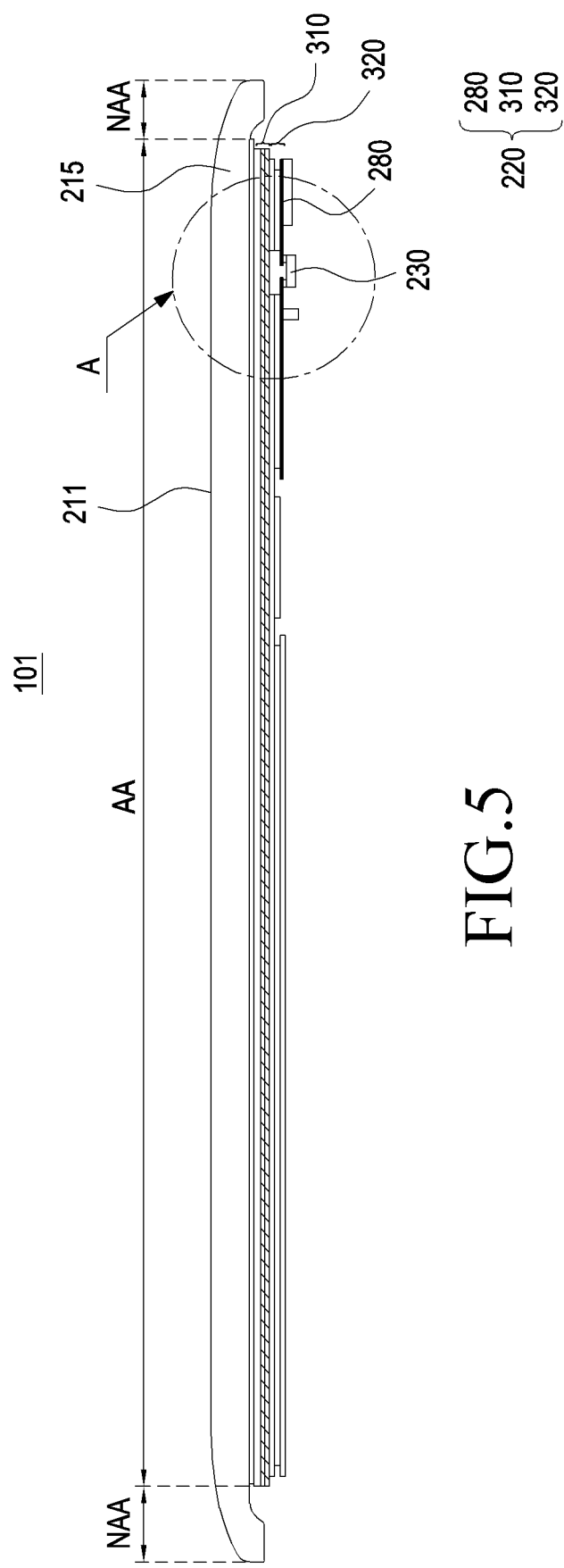
FIG. 5 is a cross-sectional view illustrating a stacked state and an electrically coupled state of a display assembly in an electronic device according to various embodiments.
Figure 6:
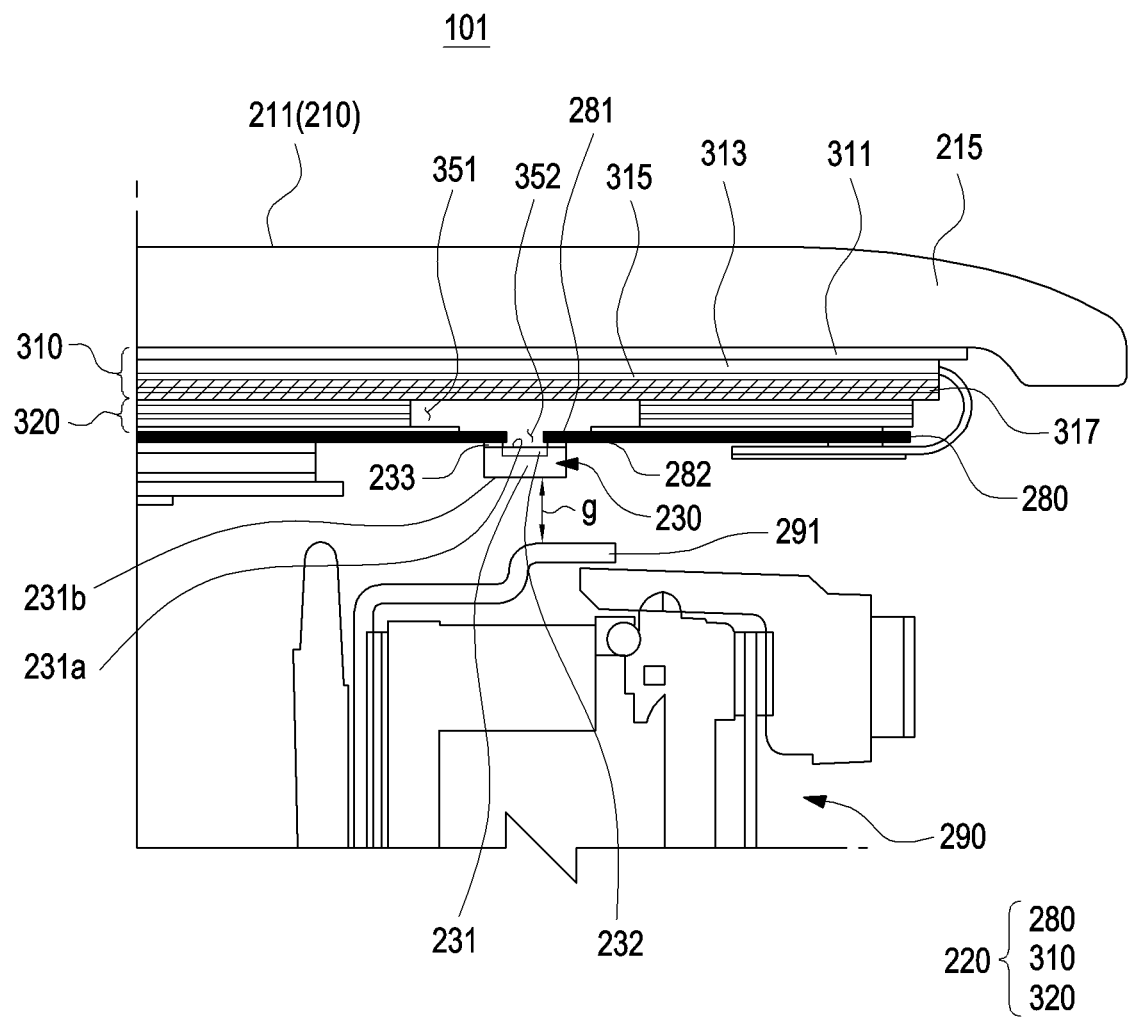
FIG. 6 is an enlarged view illustrating an area (e.g., an area A) of FIG. 5 according to various embodiments.

FIG. 5 is a sectional view illustrating a stacked state and an electrically coupled state of a display assembly in an electronic device according to various embodiments. FIG. 6 is an enlarged view illustrating an area (e.g., an area A) of FIG. 5 according to various embodiments.

According to various embodiments, the electronic device 101 may include a housing (e.g., the housing 210 of FIG. 2), the display assembly 220, the flexible circuit board 280, and the photosensor module 230. The structures of the display assembly 220 and the photosensor module 230 of FIGS. 5 and 6 may be fully or partially identical to those of the housing 210, the display assembly 220, and the photosensor module 230 of FIGS. 2 to 4.

Referring to FIGS. 5 and 6, the display assembly 220 may display a screen through the first surface 211 of the housing 210 and implement an input. For example, the display assembly 220 may be at least one of a liquid crystal display (LCD), a light emitting diode (LED) display, an organic light emitting diode (OLED) display, a microelectromechanical system (MEMS) display, or an electronic paper. A touch panel may be integrally included in the display assembly 220 to perform a touch screen function. An antenna radiator may be mounted on an inner or outer surface of the display assembly 220 to perform a wireless communication function.

According to an embodiment, the display assembly 220 may be disposed between the front plate 215 forming at least a part of the front surface of the electronic device 101 and the a rear plate (e.g., the rear plate 216 of FIG. 4) forming at least a part of the rear surface of the electronic device 101. The front plate 215 may be formed by a substantially transparent glass member or a polymer member. For example, the display assembly 220 may be directly stacked under the front plate 215 and disposed in contact with each other over a large area. The front plate 215 may be installed on the front surface of the display assembly 220 to protect the display assembly 220.

According to various embodiments, the display assembly 220 may include an upper assembly (which may also be referred to herein as an "upper portion") 310, a lower assembly (which may also be referred to herein as a "lower assembly") 320 (e.g., a cover panel), and the flexible circuit board 280. According to an embodiment, the upper assembly 310 and the flexible circuit board 280 may be integrally formed. According to an embodiment, other electronic components may be mounted in an area of the flexible circuit board 280, in which the upper assembly 310 or the lower assembly 320 is not disposed.

According to various embodiments, the touch panel 313, and a polarizing panel 315 may be sequentially stacked under an adhesive film 311 for adhering to the front plate 215, in the upper assembly 310. The lower assembly 320, which may include a layer for protecting the upper assembly 310, may be stacked on the rear surface of the display panel 317. The flexible circuit board 280 and the photosensor module 230 may be positioned under the display assembly 220. To transmit light to the photosensor module 230, through openings (hereinafter, a first opening and a second opening) may be included in one area of the lower assembly 320 and the flexible circuit board 280, when viewed from above the first surface 211.

According to various embodiments, the adhesive film 311 may be an optically clear adhesive and bond the front plate 215 and the touch panel 313 to each other. In another example, the adhesive film may bond between the touch panel 313 and the polarizing panel 315.

According to various embodiments, the touch panel 313 may be disposed between the front plate 215 and the display panel 317. The touch panel 313 may be implemented as a structure including a conductive pattern for providing an input according to a touch on or proximity to an active area (e.g., the active area AA of FIG. 5). For example, the touch panel 313 may be configured as one of a capacitive type, an electromagnetic resonance type, a resistive type, an infrared type, an electronic magnetic resonance (EMR) type, and an acoustic wave type, or a combination of these types.

According to various embodiments, the polarizing panel 315 may be disposed between the front plate 215 and the display panel 317. The polarizing panel 315 may increase the image quality of a screen provided by the display panel 317 and improve outdoor visibility.

According to various embodiments, the display panel 317, which is a layer for displaying a screen, may be, for example, an LCD layer, an LED layer, or an OLED layer. The display panel 317 may include a plurality of polymer layers. For example, one of the polymer layers may be formed of a polyimide film, and may be electrically connected, as a component for supplying power to the display panel 317, to a main circuit board (e.g., the main circuit board 240 of FIG. 4) mounted inside the housing 210 through the flexible circuit board 280. Another one of the polymer layers may be formed of polyethylene terephthalate (PET) and support the display panel 317 as a whole. The polymer layers may include bent parts (not shown) to be coupled to the flexible circuit board 280 and include structures (e.g., chip on film (COF) bending or polyimide (PI) bending) coupled to the flexible circuit board 280.

According to various embodiments, the lower assembly 320 may be stacked under the display assembly 220 to support and protect the display assembly 220 and prevent and/or reduce internal components from being viewed to the outside through the display assembly 220. One area of the lower assembly 320 may include a first opening 351 passing through the lower assembly 320. For example, the area in which the first opening 351 is formed may be an area at a predetermined (or specified) position of the active area AA of the display assembly 220 and correspond to an area in which the photosensor module 230 is disposed, and from which a part of the lower assembly 320 is removed to receive light from the outside.

According to an embodiment, the lower assembly 320 may include a short-range communication circuit. The lower assembly 320 may include at least one of an embo member, a sponge member, a cushion member, a Cu member, an absorber member, or the like, or a combination of the members. For example, the emboss member may be formed of an opaque material and used to prevent and/or reduce an internal structure from being seen through the display assembly 220. The sponge member may be used to alleviate and/or remove pressing or lifting caused by foreign substances, which may occur during adhesion in an assembly process of the display assembly 220.

According to various embodiments, the short-range communication circuit may be disposed between the lower assembly 320 and one area of the flexible circuit board 280. The short-range communication circuit may include a wireless communication circuit and a conductive panel. The wireless communication circuit may be configured to perform wireless communication based on an NFC protocol. For example, the short-range communication module may support short-range communication through the front surface of the display assembly 220. The short-distance communication module may be formed of a ferrite material, and may improve antenna performance with an antenna, prevent and/or reduce interference to internal circuits during communication, and increase communication efficiency.

According to various embodiments, the flexible circuit board 280 may be disposed under the lower assembly 320 and electrically coupled to the display assembly 220. For example, the flexible circuit board 280 may also be referred to as a display circuit board, and may have one end electrically coupled to the upper assembly 310 through COF bending or PI bending and the other end electrically coupled to the main circuit board. The flexible circuit board 280 may include a first surface 281 facing the front plate 215 and a second surface 282 facing the first surface 281. One area of the flexible circuit board 280 may include a second opening 352 passing through the flexible circuit board 280. For example, the area in which the second opening 352 is formed may be an area which is at a predetermined (or specified) position of the active area AA of the display assembly 220 and corresponds to the area in which the photosensor module 230 is disposed, and from which a part of the flexible circuit board 280 is removed for the photosensor module 230 to receive light from the outside.

According to various embodiments, at least a part of the first opening 351 of the lower assembly 320 may be disposed to correspond to the second opening 352 of the flexible circuit board 280. The first opening 351 and the second opening 352 may guide a path of light directed to the photosensor module 230, and the size of the first opening 351 may be larger than the size of the second opening. For example, the first opening 351 may be formed to be large than the second opening 352 in consideration of the attachment tolerance of the flexible circuit board 280 during manufacture of the electronic device 101 to secure an FOV, while an sensing area of the photosensor module 230 is not covered. As the second opening 352 is smaller size than the first opening 351, a part of the first surface 281 of the flexible circuit board 280 may be provided as a part forming the first opening 351, facing the upper assembly (e.g., the display panel 315).

According to various embodiments, when viewed from the top of the electronic device 101, the photosensor module 230 may be disposed at a predetermined (or specified) position of the active area AA of the display assembly 220, and positioned to correspond to the first opening 351 and the second opening 352 to receive external light. The photosensor module 230 may be disposed under the flexible circuit board 280, with at least a part thereof positioned to correspond to the second opening 352 of the flexible circuit board 280. For example, one surface of the photosensor module 230 may be disposed to cover the second opening 352. In another example, the photosensor module 230 may be disposed on the second opening 352 and along the periphery of the second opening 352 on one surface (e.g., the second surface 282) of the flexible circuit board 280. As the photosensor module 230 covers the first opening 351, the photosensor module 230 may also cover the second opening 352, and external light may pass through the front plate 215, the display assembly 220, the second opening 352, and the first opening 351 and reach the photosensor module 230. The light reaching the photosensor module 230 may transmit a sensed light value to the processor, and the processor may adjust the brightness of the display assembly 220 according to an external brightness.

According to an embodiment, the photosensor module 230 may include a sensor substrate 231 (e.g., a sensor IC), a sensing unit 232 formed in one area of the sensor substrate 231, and a plurality of pads 233 spaced apart from the sensing unit 232. The sensor substrate 231 may include a first surface 231a facing the display assembly 220 and a second surface 231b facing in a direction opposite to the first surface 231a. The sensing unit 232 may be formed in a central area of the first surface 231a of the sensor substrate 231 and directly receive external light passing through the first opening 351 and the second opening 352. The plurality of pads 233 may be formed in edge areas of the first surface 231a of the sensor substrate 231 and electrically couple the sensor substrate 231 to the rear surface of the flexible circuit board 280. For example, the plurality of pads 233 may be positioned along the periphery of the sensing unit 232 and directly couple the sensor substrate 231 with the flexible circuit board 280 through soldering. The flexible circuit board 280 electrically coupled to the photosensor module 230 may be coupled to the main circuit board (e.g., the main circuit board 240 of FIG. 4) and transmit a signal from the photosensor module 230 to the main circuit board.

According to an embodiment, the display assembly 220 may be disposed in a front direction of the photosensor module 230, and another device 290 of the electronic device 101 may be disposed in a rear direction of the photosensor module 230. The device 290 may be an internal electronic component (e.g., a battery and various circuit boards), a bracket for mounting the internal electronic component therein, or a support member 291 coupled to the internal electronic component or the bracket. The photosensor module 230 and the device 290 may be disposed to be spaced apart from each other by a specified gap (e.g., a first distance g). For example, the second surface 231b of the sensor substrate 231 may be disposed to be spaced apart from the support member 291, and the spaced area may form an air gap. Although the photosensor module is generally manufactured, while being coupled to a separate substrate, a separate substrate or an interposer configuration to be coupled with the rear surface of the photosensor module 230 is not required, thereby simplifying a product and reducing cost according to the embodiment of the disclosure.

Figure 7:
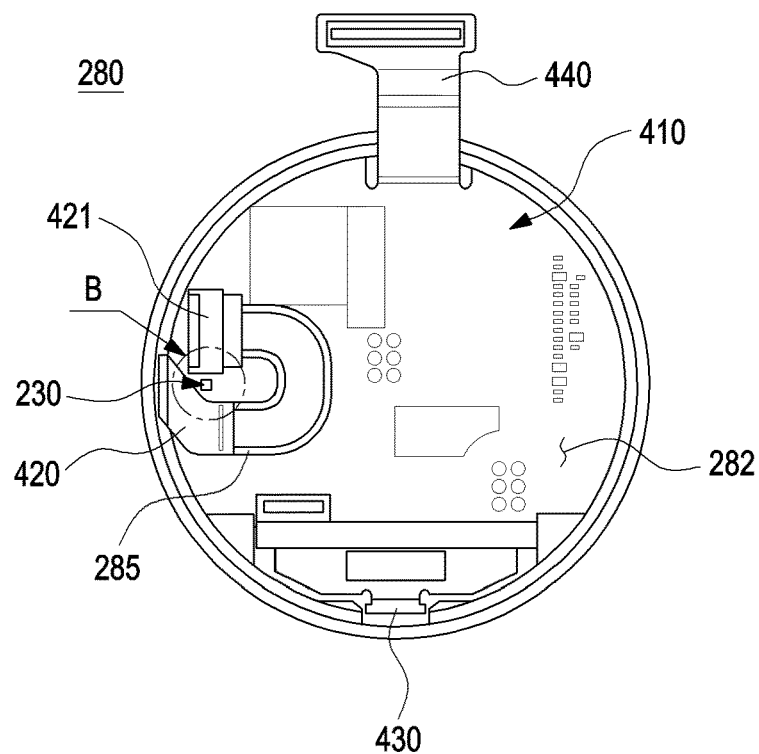
FIG. 7 is a diagram illustrating a flexible circuit board according to various embodiments.
Figure 8:
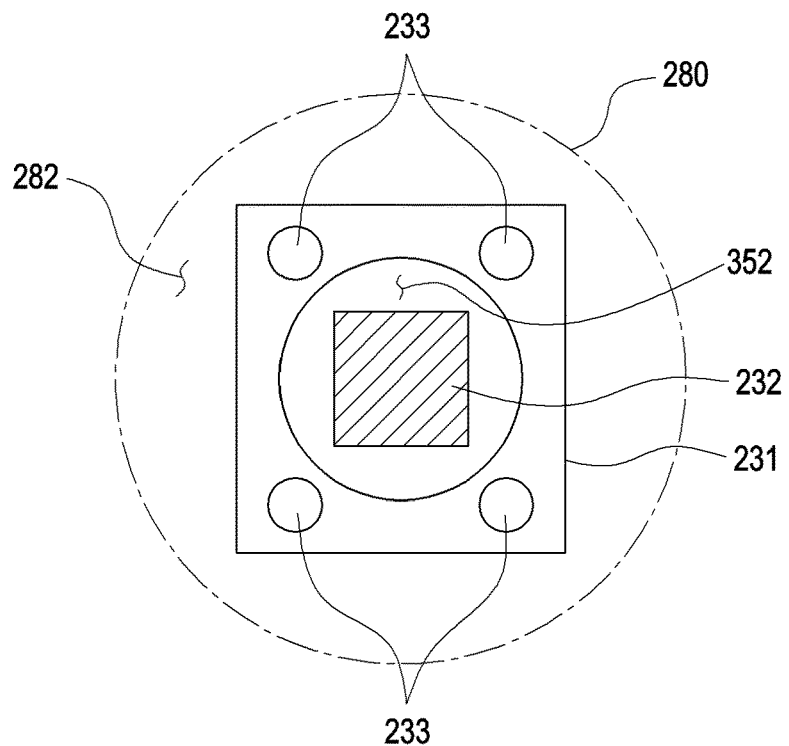
FIG. 8 is a diagram illustrating a photosensor module in an enlargement of an area (e.g., area B) of FIG. 7 according to various embodiments.

FIG. 7 is a diagram illustrating a flexible circuit board according to various embodiments, and FIG. 8 is a diagram illustrating a photosensor module in an enlargement of an area (e.g., an area B) of FIG. 7 according to various embodiments. Although FIG. 8 is a view seen from the rear of the photosensor module, it is illustrated as a projection view, for convenience of description.

According to various embodiments, an electronic device (e.g., the electronic device 101 of FIGS. 2 and 3) may include the flexible circuit board 280 and the photosensor module 230. The flexible circuit board 280 may include a flat base 410, a first bent part 420 extending from the base 410, a second bent part 430, and a third bent part 440. According to an embodiment, the base 410 is a single panel which may be an unbreakable (UB) panel (e.g., a panel formed of a polymer plate), and a non-panel area of the base 410 may be folded to be used as the flexible circuit board. In another example, the panel and the flexible circuit board 280 may be integrally formed.

The structures of the flexible circuit board 280 and the photosensor module 230 of FIGS. 7 and 8 may be fully or partially identical to those of the flexible circuit board 280 and the photosensor module 230 of FIGS. 5 and 6.

Referring to FIG. 7, the first bent part 420, the second bent part 430, and the third bent part 440 may be bent from an end portion of the circular flexible circuit board 280 and extend in different directions.

According to various embodiments, the first bent part 420 may be coupled to the flexible circuit board 280 through a connector 421. The connector 421 may include a zigzag in-line package (ZIP) connector. The connector 421 may be disposed on the second surface 282 (e.g., rear surface) of the flexible circuit board 280.

According to an embodiment, the first bent part 420 may be curved to be easily coupled to the connector 421. For example, the first bent part 420 may be bent in a "U" shape. As the first bent part 420 is curved, a length of the first bent part 420 protruding to the outside of the display assembly 220 is reduced, thereby reducing the bezel area of the electronic device 101.

According to an embodiment, the flexible circuit board 280 may include a groove 285 corresponding to the first bent part 420 on the second surface 282 (e.g., the rear surface). The first bent part 420 may be mounted in the groove 285 to reduce a thickness formed by the bending of the first bent part 420.

According to various embodiments, the first bent part 420 and the second bent part 430 may be disposed in substantially perpendicular directions. For example, a direction in which an end portion of the first bent part 420 to be coupled to a touch panel (e.g., the touch panel 313 of FIG. 6) through the connector 421 faces may be perpendicular to a direction in which an end portion of the second bent part 430 extending toward the upper assembly (e.g., the touch panel 313 of FIG. 6) faces.

According to various embodiments, the third bent part 440 may be formed to extend from the flexible circuit board 280. The third bent part 440 may be electrically coupled to the flexible circuit board 280 and the main circuit board (e.g., the main circuit board 240 of FIG. 4) that controls the operation of the electronic device 101. According to an embodiment, the third bent part 440 may be disposed in the direction which is opposite to the direction in which the second bent part 430 and substantially perpendicular to the direction in which the first net part 420 is disposed, on the flexible circuit board 280.

Referring to FIG. 8, the photosensor module 230 may be disposed in one area of the second surface 282 (e.g., rear surface) of the flexible circuit board 280. The photosensor module 230 may include the sensor substrate 231, the sensing unit 232, and the plurality of pads 233. The photosensor module 230 may be disposed in an area corresponding to the second opening 352 penetrating through the flexible circuit board 280, and the sensing unit 232 for receiving external light may be formed to be smaller than the second opening 352 so that a whole area of the sensing unit substantially facing forward may receive light.

According to an embodiment, the plurality of pads 233 may be positioned between the sensor substrate 231 and the flexible circuit board 280. The plurality of pads 233 may be solder pads surface-mounted along the periphery of the second opening 352 of the flexible circuit board 280 and bonded to the second surface 282 (e.g., rear surface) of the flexible circuit board 280 by soldering. To stably couple the sensor substrate 231 with the flexible circuit board 280, a total of four pads 233 may be positioned at corner areas of the sensor substrate 231. However, the number of pads is not limited to 4, and the design may be modified to a larger or smaller number of pads, for stable coupling of the sensor substrate 231.

Figure 9A:
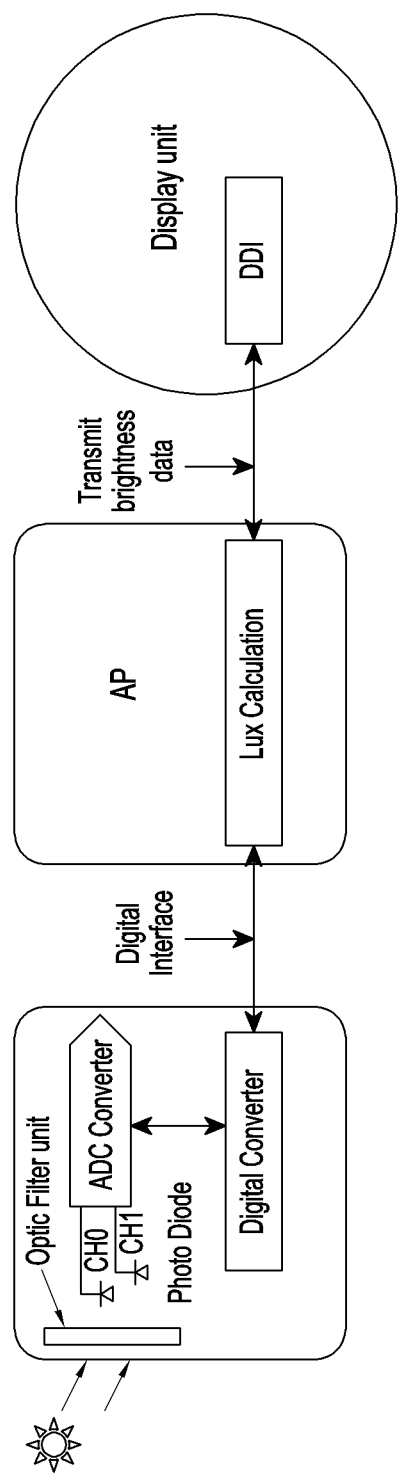
FIGS. 9A and 9B are diagrams illustrating an example process of driving a photosensor module in an electronic device according to various embodiments.
Figure 9B:
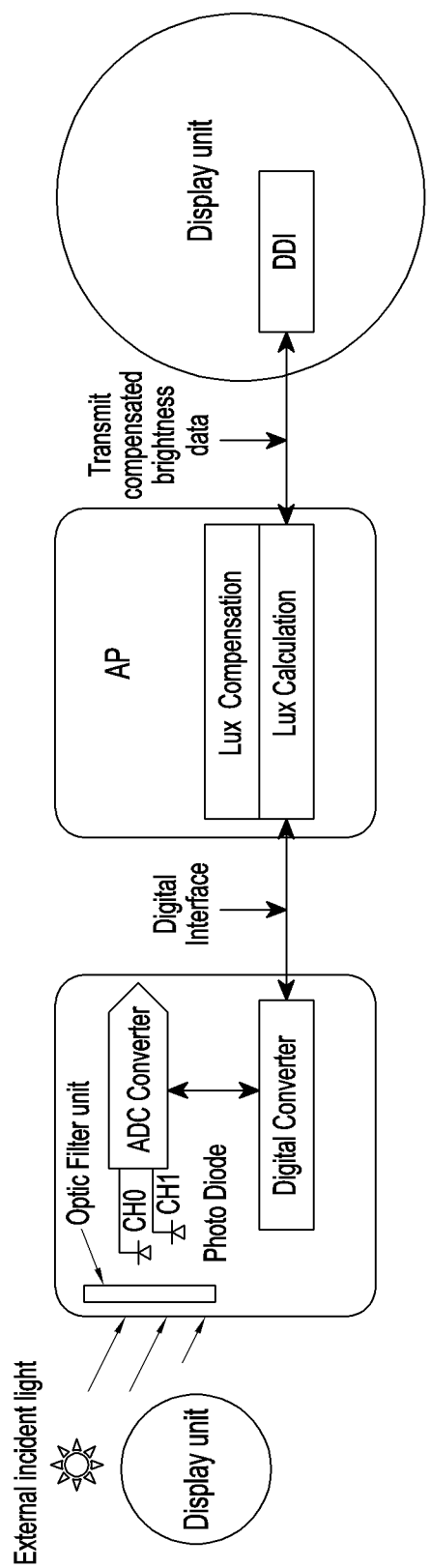

FIGS. 9A and 9B are diagrams illustrating an example process of driving a photosensor module in an electronic device according to various embodiments.

Referring to FIGS. 9A and 9B, an electronic device may include a photosensor module. The photosensor module may be an illuminance sensor module. External incident light may be filtered through an illuminance sensor filter of the illuminance sensor module. In addition, a photo diode of the illuminance sensor module may convert filtered data into an electrical signal. The electric signal at an analog level obtained by the photo diode may be converted into an electric signal at a digital level through an ADC converting block.

According to various embodiments, when interference occurs due to light of a display assembly in obtaining intact external incident light introduced into the illuminance sensor module, data such as the amount of light entering the display assembly may be periodically turned off at a specific time to be synchronized with a sensing time of the sensor module.

According to various embodiments, an actual external light amount may be detected from digital level data of incident light changed through the illuminance sensor module, and the brightness of the display assembly may be automatically adjusted according to the detected value.

According to various embodiments, the illuminance sensor module may be positioned to face a cover panel on the rear surface of the display assembly so as to be disposed in the active area of the display assembly. In this case, an error may occur in light amount detection of the illuminance sensor module due to light emission from the display assembly in a low illuminance environment. Therefore, when both transmission and reception are possible in a display driver IC (DDI) and pixel information of the DDI may be interpreted, an external illuminance may be determined by removing error data generated during the light emission of the display assembly from information about incident light obtained from the illuminance sensor module based on information (e.g., luminance, color, and so on) received from the DDI, and transmitted to the display assembly. According to an embodiment of the disclosure, the actual brightness of the display assembly may be corrected by reflecting light generated from the display assembly of the electronic device.

According to various example embodiments of the disclosure, an electronic device (e.g., the electronic device 101 of FIGS. 1 to 6) may include: a housing (e.g., 210 in FIG. 6) including a front plate (e.g., 215 in FIG. 4) facing a front surface and a rear plate (e.g., 216 in FIG. 4) facing a rear surface, a display assembly (e.g., 220 in FIG. 6) comprising a display visible through at least a part of the front plate, wherein the display assembly includes an upper portion (e.g., 310 in FIG. 6), a lower portion (e.g., 320 in FIG. 6) overlapping at least a partial area of the upper assembly and including a first opening (e.g., 351 in FIG. 6), and a flexible circuit board (e.g., 280 in FIG. 6) overlapping at least a partial area of the lower portion and including a second opening (e.g., 352 in FIG. 6) corresponding to at least a part of the first opening, a photosensor module (e.g., 230 in FIG. 6) including a sensing unit (e.g., 232 in FIG. 6) comprising a sensor corresponding to at least a part of the second opening and a plurality of pads (e.g., 233 in FIG. 6) disposed adjacent to the sensing unit and electrically coupled to the flexible circuit board, and an electrical component comprising circuitry and/or a mechanical structure (e.g., 290 in FIG. 6) disposed between the photosensor module and the rear plate and spaced apart from the photosensor module by a first distance.

According to various example embodiments, when viewed from above the front plate, the first opening may be larger than the second opening in size.

According to various example embodiments, the photosensor module may be disposed under the flexible circuit board and configured to detect at least a part of light passing through the first opening of the lower assembly and the second opening of the flexible circuit board from the outside of the housing.

According to various example embodiments, the display assembly may include an active area (e.g., AA in FIG. 5) configured to display a screen and a non-active area (e.g., NAA in FIG. 6) formed along a periphery of the active area. When viewed from above the front plate, the first opening and the sensing unit may be positioned in at least a part of the active area.

According to various example embodiments, the upper portion may include a touch panel (e.g., 313 in FIG. 6) and a display panel (e.g., 317 in FIG. 6), and the lower portion may be disposed under the upper portion and supports or protects the upper portion. The first opening may be formed to pass through the lower portion.

According to various example embodiments, the lower portion may include various parts and a communication circuit, and the various parts may include at least one of an emboss part, a sponge part, a cushion part, a copper (Cu) part, or an absorber part, or a combination of the parts.

According to various example embodiments, the photosensor module (e.g., 230 in FIG. 6) may include a sensor substrate (e.g., 231 in FIG. 6) including a first surface (e.g., 231*a* in FIG. 6) facing the display assembly and a second surface (e.g., 231*b* in FIG. 6) facing a direction opposite to the first surface, the sensing unit (e.g., 232 in FIG. 6) disposed on the first surface of the sensor substrate and configured to receive external light, and the plurality of pads (e.g., 233 in FIG. 6) formed on the first surface of the sensor substrate and spaced apart from the sensing unit.

According to various example embodiments, the plurality of pads may include solder pads, and may be directly coupled with a rear surface of the flexible circuit board by soldering.

According to various example embodiments, the sensing unit may be positioned in a central area of the first surface, and the plurality of pads may be positioned in edge areas of the first surface along a periphery of the sensing unit.

According to various example embodiments, the first opening or the second opening may be larger than the sensing unit in size.

According to various example embodiments, a gap between the photosensor module and the electrical component or mechanical structure may be filled with air.

According to various example embodiments, the flexible circuit board may include a first surface (e.g., 281 in FIG. 6) facing the front plate and a second surface (e.g., 282 in FIG. 6) facing the rear plate, and the first surface may face at least a partial area of the upper portion and form the second opening together with the upper portion and the lower portion.

According to various example embodiments, the photosensor module may be disposed in the second opening and around a periphery of the second opening on the second surface to cover the second opening.

According to various example embodiments, the flexible circuit board may include a bent part (e.g., 420, 430, and 440 in FIG. 7), and the electronic device may further include a main circuit board (e.g., 240 in FIG. 4) electrically coupled to the flexible circuit board through the bent part.

According to various example embodiments, the photosensor module may include an illuminance sensor.

According to various example embodiments of the disclosure, an electronic device (e.g., the electronic device 101 of FIGS. 1 to 6) may include: a front plate (e.g., 215 in FIG. 4) forming at least a part of a front surface of the electronic device, a rear plate (e.g., 216 in FIG. 4) forming a least a part of a rear surface of the electronic device, a display assembly (e.g., 220 in FIG. 6) comprising a display disposed adjacent to the front plate and visible through at least a part of the front plate, wherein the display assembly includes a plurality of layers (e.g., 310 and 320 in FIG. 6) with a first opening (e.g., 351 in FIG. 6) passing through at least some of the layers formed therein, and a flexible circuit board (e.g., 280 in FIG. 6) disposed under the plurality of layers and including a second opening (e.g., 352 in FIG. 6) smaller than the first opening and corresponding to at least a part of the first opening, and a photosensor module (e.g., 230 in FIG. 6) positioned under the flexible circuit board and coupled with the flexible circuit board through a plurality of pads (e.g., 233 in FIG. 6).

According to various example embodiments, the display assembly may include an upper portion and a lower portion. The first opening may be formed to pass through the lower portion, and the second opening may pass through the flexible circuit board and be configured to guide external light to the photosensor module.

According to various example embodiments, the electronic device may further include an electrical component comprising circuitry and/or mechanical structure comprising a support disposed between the photosensor module and the rear plate and spaced apart from the photosensor module by a first distance.

According to various example embodiments, the photosensor module may include a sensor substrate including a first surface facing the display assembly and a second surface facing in a direction opposite to the first surface, a sensing unit comprising a sensor corresponding to the second opening on the first surface of the sensor substrate and configured to receive external light, and the plurality of pads formed on the first surface of the sensor substrate and spaced apart from the sensing unit.

According to various example embodiments, the plurality of pads may include solder pads, and may be directly coupled with a rear surface of the flexible circuit board by soldering.

While the disclosure has been illustrated and described with reference to various example embodiments, it will be understood that the various example embodiments are intended to be illustrative, not limiting. It will be further understood by those skilled in the art that various changes in form and detail may be made without departing from the true spirit and full scope of the disclosure, including the appended claims and their equivalents. It will also be understood that any of the embodiment(s) described herein may be used in conjunction with any other embodiment(s) described herein.

What is claimed is:

1. An electronic device comprising:
a housing including a front plate facing a front surface and a rear plate facing a rear surface;
a display assembly comprising a display visible through at least a part of the front plate;
wherein the display assembly includes:
an upper portion;
a lower portion overlapping at least a partial area of the upper portion and including a first opening; and
a flexible circuit board overlapping at least a partial area of the lower portion and including a first surface facing the lower portion, a second surface opposite to the first surface, and a second opening corresponding to at least a part of the first opening,
wherein the lower portion is disposed between the upper portion and the flexible circuit board; and
a photosensor module including a sensing unit comprising a sensor corresponding to at least a part of the second opening and a plurality of pads disposed adjacent to the sensing unit and electrically coupled to the flexible circuit board, wherein the plurality of pads are disposed between the sensing unit and the second surface of the flexible circuit board to space the sensing unit apart from the second surface of the flexible circuit board,
wherein the photosensor module is disposed completely under the second surface of the flexible circuit board and configured to detect at least a part of light sequentially passing through the upper portion, the first opening of the lower portion and the second opening of the flexible circuit board from an outside of the electronic device,
wherein the flexible circuit board includes a base, first bent part extending from the base in a first direction and towards the front surface and disposed on the second surface around the photosensor module, and a second bent part extending from the base in a second direction that is perpendicular to the first direction and towards the front surface, and at least one of the first bent part and the second bent part connected to the upper portion, and
wherein the first bent part is coupled to a groove included on the second surface and adjacent to an edge of the flexible circuit board, the first bent part is curved around the edge of the flexible circuit board towards the front surface, and the first bent part is bent in a U-shape that at least partially surrounds the photosensor module when viewed from below the rear plate.

2. The electronic device of claim 1, wherein when viewed from above the front plate, the first opening is larger than the second opening in size.

3. The electronic device of claim 1, comprising a mechanical structure disposed between the photosensor module and the rear plate and spaced apart from the photosensor module by a first distance.

4. The electronic device of claim 1, wherein the display assembly includes an active area displaying a screen, and wherein when viewed from above the front plate, the first opening and the sensing unit are positioned in at least a part of the active area.

5. The electronic device of claim 1, wherein the upper portion includes a touch panel and a display panel,
wherein the lower portion is disposed under the upper portion and is configured to support or protect the upper portion, and
wherein the first opening passes through the lower portion.

6. The electronic device of claim 5, wherein the lower portion includes various parts and a communication circuit, and
wherein the various parts include at least one of an emboss part, a sponge part, a cushion part, a copper (Cu) part, or an absorber part, or a combination of the parts.

7. The electronic device of claim 1, wherein the photosensor module includes:
a sensor substrate including a first surface facing the display assembly and a second surface facing in a direction opposite to the first surface;
the sensing unit formed on the first surface of the sensor substrate and configured to receive external light; and
the plurality of pads formed on the first surface of the sensor substrate and spaced apart from the sensing unit.

8. The electronic device of claim 7, wherein the plurality of pads include solder pads, and
wherein the plurality of pads are directly coupled with a rear surface of the flexible circuit board by soldering.

9. The electronic device of claim 8,
wherein the sensing unit is positioned in a central area of the first surface of the sensor substrate, and
wherein the plurality of pads are positioned in edge areas of the first surface of the sensor substrate along a periphery of the sensing unit.

10. The electronic device of claim 8, wherein the first opening or the second opening is larger than the sensing unit in size.

11. The electronic device of claim 1, comprising an electrical component including circuitry and/or a mechanical structure disposed between the photosensor module and the rear plate and spaced apart from the photosensor module with an air gap therebetween.

12. The electronic device of claim 5,
wherein the first surface of the flexible circuit board faces at least a partial area of the upper portion and includes the second opening together with the upper portion and the lower portion.

13. The electronic device of claim 7, wherein the plurality of pads are configured to displace the first surface of the sensor substrate from the second opening by a height of the plurality of pads.

14. The electronic device of claim 1, wherein the flexible circuit board includes a third bent part extending from the base in a third direction that is opposite to the second direction,
wherein the electronic device further comprises a main circuit board electrically coupled to the flexible circuit board through the third bent part.

15. The electronic device of claim 1, wherein the photosensor module includes an illuminance sensor.

16. An electronic device comprising:
a front plate forming at least a part of a front surface of the electronic device;
a rear plate forming a least a part of a rear surface of the electronic device;

a display assembly including a display disposed adjacent to the front plate and visible through at least a part of the front plate, wherein the display assembly includes:

a plurality of layers with a first opening passing through at least some of the layers formed therein, and a flexible circuit board disposed under the plurality of layers and including a first surface facing the plurality of layers, a second surface opposite to the first surface, and a second opening smaller than the first opening and corresponding to at least a part of the first opening; and a photosensor module positioned completely under the second surface of the flexible circuit board and coupled to the second surface of the flexible circuit board through a plurality of pads, wherein the plurality of pads are disposed on the second surface of the flexible circuit board to space the photosensor module apart from the second surface of the flexible circuit board, wherein the flexible circuit board includes a base, a first bent part extending from the base in a first direction and towards the front surface and disposed on the second surface around the photosensor module, and a second bent part extending from the base in a second direction that is perpendicular to the first direction and towards the front surface, and at least one of the first bent part and the second bent part connected to the upper portion, and wherein the first bent part is coupled to a groove included on the second surface and adjacent to an edge of the flexible circuit board, the first bent part is curved around the edge of the flexible circuit board towards the front surface, and the first bent part is bent in a U-shape that at least partially surrounds the photosensor module when viewed from below the rear plate.

17. The electronic device of claim 16, wherein the display assembly includes an upper portion and a lower portion, and wherein the first opening is formed to pass through the lower portion, and the second opening is formed to pass through the flexible circuit board and is configured to guide external light to the photosensor module.

18. The electronic device of claim 16, further comprising an electrical component including circuitry and/or mechanical structure including a support disposed between the photosensor module and the rear plate and spaced apart from the photosensor module by a first distance.

19. The electronic device of claim 16, wherein the photosensor module comprising:

a sensor substrate including a first surface facing the display assembly and a second surface facing in a direction opposite to the first surface;

a sensing unit comprising a sensor corresponding to the second opening on the first surface of the sensor substrate and configured to receive external light; and the plurality of pads formed on the first surface of the sensor substrate and spaced apart from the sensing unit.

20. The electronic device of claim 16, wherein the plurality of pads include solder pads, and the solder pads coupled with a rear surface of the flexible circuit board by soldering.

* * * * *